United States Patent [19]

Gaston et al.

[11] Patent Number: 4,947,112

[45] Date of Patent: Aug. 7, 1990

[54] APPARATUS AND METHOD FOR TESTING PRINTED CIRCUIT BOARDS

[75] Inventors: Howard N. Gaston; Walter W. Jones, Jr., both of Benton, Ark.

[73] Assignee: AT&T Bell Laboratories, Murray Hill, N.J.

[21] Appl. No.: 387,055

[22] Filed: Jul. 28, 1989

[51] Int. Cl.$^5$ ............................................. G01R 31/02
[52] U.S. Cl. .............................. 324/158 F; 324/158 P
[58] Field of Search ........... 324/158 F, 158 P, 73 PC, 324/73 R

[56] References Cited

U.S. PATENT DOCUMENTS

| | | | |
|---|---|---|---|
| 3,824,462 | 7/1974 | Vinsani | 324/73 PC |
| 3,870,953 | 3/1975 | Boatman et al. | 324/73 R |
| 4,229,693 | 10/1980 | Irick et al. | 324/158 F |
| 4,841,231 | 6/1989 | Angelucci | 324/158 F |

Primary Examiner—Reinhard J. Eisenzopf
Assistant Examiner—Vihn P. Nguyen
Attorney, Agent, or Firm—A. A. Tirva

[57] ABSTRACT

Apparatus and method for electrical testing of a printed circuit (PC) board having a circuit layout wherein circuit paths interconnect selected plated through holes and components are mounted on the board by insertion of component leads through predetermined plated through holes in the board. The test apparatus includes a test board having a circuit layout identical to the circuit layout of the PC board. The test board does not have components mounted on it, but has instead test probes extending through predetermined plated through holes on the test board. The test probes are soldered to the circuit paths on the test board establising electrical connections between predetermined test probes via circuit paths on the test board. To test the PC board, test probes are brough into contact with components leads on the PC board and since electrical interconnections already exist between certain test probes, electrical interconnections between components on the PC board are established via the test probes and circuit paths on the test board allowing electrical testing of the PC board before the component leads are soldered to the PC board.

5 Claims, 1 Drawing Sheet

//
U.S. Patent
Aug. 7, 1990
4,947,112
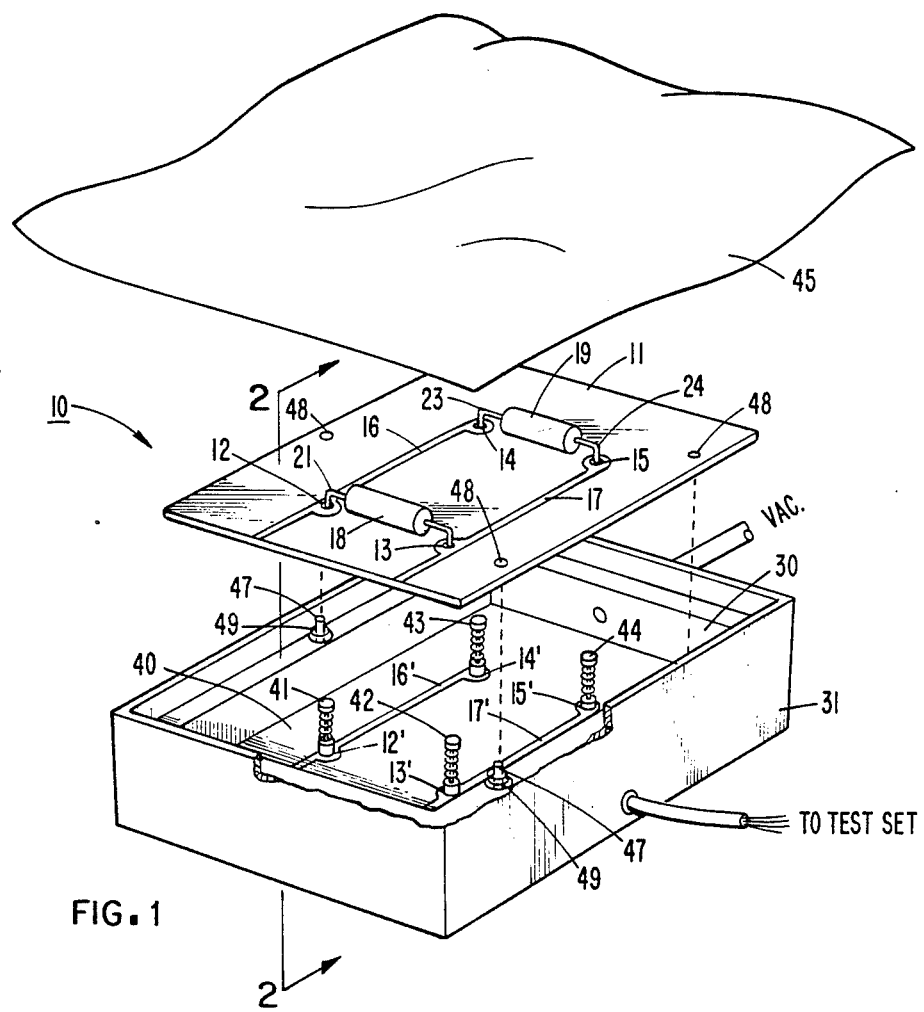
FIG. 1
FIG. 2
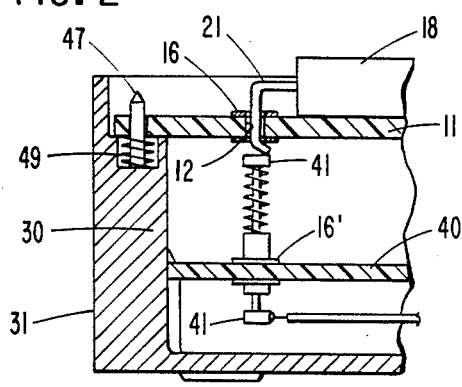
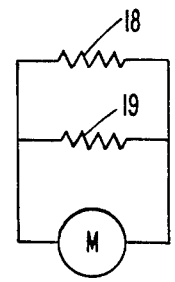
FIG. 3

APPARATUS AND METHOD FOR TESTING PRINTED CIRCUIT BOARDS

TECHNICAL FIELD

This invention relates to automated manufacturing of printed circuit boards and more particularly to automated testing of such boards.

BACKGROUND OF THE INVENTION

Many complex electronic equipments are constructed of a number of discrete circuit modules in the form of printed circuit boards having circuit paths formed on each side to which may be connected various electrical components. Interconnections between circuit paths on opposite sides of the boards are accomplished by plated through holes. The plated through holes also function as receptacles for leads emanating from the electrical components. In the automated manufacturing of the boards, electrical components are inserted into the boards through the plated through holes by a component insertion machine. The component leads are then cut and cinched by the insertion machine, and then typically a visual check is made to ensure that component leads are present in predetermined holes. The boards then go through a soldering stage wherein the component leads are soldered to the board. Presently, only after the component leads are soldered, i.e. positive electrical connections are established between component leads and circuit paths, can electrical circuit testing be done to determine whether the right components have been inserted, whether the component is correctly oriented, whether the component is operable and whether the component meets the required circuit specifications.

When a defect is detected during the electrical testing, the defective part or parts have to be unsoldered which may damage the board and other components which are located nearby. Such a repair operation is very labor intensive and requires a relatively high labor grade personnel to perform. Because of the difficulty of repair of the boards after soldering, it has been recognized for a long time that it would be advantageous to perform electrical circuit testing on the board before the components are soldered to the board.

The problem, however, in performing electrical testing before component leads are soldered to the board is that there is no way to ensure that the components on the board are in fact electrically interconnected by predetermined circuit paths on the board. Consequently, a test result may indicate a defect with a component or circuit where in fact the problem may be caused by a poor or a complete absence of electrical connection between component leads and circuit paths on the board.

SUMMARY OF THE INVENTION

In accordance with the present invention, we provide test apparatus and method for testing a printed circuit board before the component leads are soldered to the board. Apparatus includes a test board which has a circuit layout identical to the circuit layout of the board under test, but in place of components, it has a plurality of test probes which project from the major surface of the board through the plated through holes and are adapted to contact leads of components mounted on the board to be tested. The test probes are soldered to the test board establishing electrical connections between selected test probes by circuit paths on the test board whereby electrical interconnections between components on the board are ensured via the test probes and the circuit paths on the test board.

BRIEF DESCRIPTION OF THE DRAWING

FIG. 1 is a partially exploded perspective view of the test apparatus for testing a printed circuit board.

FIG. 2 is a partial sectional view of the test apparatus taken generally along the line 2—2 of FIG. 1 showing the elements of the present invention.

FIG. 3 is a schematic representation of the circuit implemented on the printed circuit board shown in FIG. 1.

DETAILED DESCRIPTION

Referring now to FIG. 1 there is shown a printed circuit (PC) board testing apparatus 10 comprising the present invention. The invention will be described with respect to a PC board 11 having an electrical circuit as shown in FIG. 3. Board 11, as illustrated in FIG. 1, is typically constructed of a plastic material which is coated on both sides with a thin copper film that is photo-etched to define various circuit paths. Circuit paths on one side may be connected to circuit paths on the opposite sides by means of plated through holes. The plated through holes also function as receptacles for leads emanating from various circuit components such as resistors, transistors, inductors, capacitors or intergrated circuits. To illustrate the principle of the invention, the PC board 11 as shown has plated through holes 12, 13, 14 and 15 and printed circuit paths 16 and 17 connecting holes 12 and 14 and 13 and 15, respectively. Two resistors 18 and 19 have their leads 21 and 22 and 23 and 24 inserted through holes 12 and 13 and 14 and 15, respectively. In automated manufacturing of PC boards, a component insertion machine (not shown) is used to insert the component leads of the two resistors. After insertion, the machine cuts and cinches leads 21 through 24 on the side of the board opposite to the one upon which the components are located. The board 11 is then placed on a support 30 which is mounted in a test enclosure 31.

Support 30 has guide pins 47 which mate with locating holes 48 on board 11 to position the board 11 directly above a test board 40 which is mounted inside the enclosure 31. Coil springs 49 keep the board 11 a predetermined distance above support 30. The test board 40 has a circuit layout which is identical to the circuit layout of the board 11. The plated through holes 12' through 15' on test board 40 correspond to plated through holes 12 through 15 on the board 11. Circuit paths 16' and 17' correspond to circuit paths 16 and 17 on board 11. In place of component leads 21 through 24, test probes 41 through 44 are positioned in the plated through holes 12' through 15', respectively, and are soldered to the circuit paths 16' and 17' establishing electrical interconnections between test probes 41 and 43 and 42 and 44.

To perform the electrical testing of the board 11 before soldering, a flexible cover 45 made of a material impervious to air is placed over the board 11 and air is evacuated from the enclosure 31 such that a vacuum is created which holds the cover 45 against board 11 whereby the components 18 and 19 are held in place during the test. As illustrated in FIG. 2, at the same time board 11 resting on springs 49 moves down until test probes 41 through 44 contact component leads 21 through 24, respectively. Because test probes 41 and 43 and 42 and 44 are electrically interconnected via circuit paths 16' and 17', it does not matter whether or not component leads 21 through 24 are electrically interconnected via the circuit paths 16 and 17 on board 11. A meter (not shown) connected across test probes 41 and 42 will read the value of resistors 18 and 19 in a parallel arrangement.

We claim:

1. Apparatus for testing a circuit on a printed circuit (PC) board, the board having a circuit layout which includes a plurality of plated through holes and circuit paths connecting selected of said plated through holes, said circuit comprising a plurality of electrical components, the components having leads which are inserted through predetermined holes on the PC board, said apparatus comprising:

means for firmly holding said components on the PC board before the components are soldered to the board;

a test board having a circuit layout identical to said circuit layout of the PC board;

a plurality of tests probes extending through predetermined plated through holes on the test board, said test probes being soldered to the test board establishing electrical connections between predetermined test probes via circuit paths on the test board;

means for bringing said test probes into contact with leads of said components located on the PC board whereby electrical interconnections between said components are established via said test probes and circuit paths on said test board; and means connected to said test probe for testing said circuit on the PC board.

2. Apparatus as defined in claim 1 wherein said means for holding said components on the PC board includes an air tight enclosure upon which the PC board is located, a flexible cover which is placed on said board covering the board and means for evacuating air from said enclosure.

3. Apparatus as defined in claim 2 wherein said test board is located within said enclosure.

4. Apparatus as defined in claim 1 wherein said means for holding said components on the PC board includes means for moving said PC board down a predetermined distance.

5. A method of testing a circuit on a printed circuit (PC) board having a circuit layout with plated through holes and circuit paths connecting selected of said plated through holes, said circuit comprising a plurality of electrical components, the components having leads inserted through predetermined holes on the PC board and having said leads cut and cinched to keep the components on the board until a soldering operation, the method comprising:

holding the components firmly on the board such that component leads remain in their respective holes;

locating the PC board over a test board having a circuit layout identical to the circuit layout of the PC board wherein the test board has a plurality of test probes extending through the plated through holes in the test board, said test probes being soldered to the test board;

bringing the test probes into contact with leads of the components mounted on the PC board whereby electrical interconnections between components on the PC board are established via said test probes and circuit paths on said test board;

connecting said test probes to a test apparatus; and testing said circuit on the PC board.

* * * * *